(12) United States Patent
Al-Dabagh et al.

(10) Patent No.: US 10,474,515 B2
(45) Date of Patent: Nov. 12, 2019

(54) DEBUGGING TRANSLATION BLOCK AND DEBUGGING ARCHITECTURE

(71) Applicant: Intel IP Corporation, Santa Clara, CA (US)

(72) Inventors: Baraa Al-Dabagh, Redwood City, CA (US); Dongsheng Bi, Fremont, CA (US); Roi Uziel, Santa Clara, CA (US)

(73) Assignee: Intel IP Corporation, Santa Clara, CA (US)

( * ) Notice: Subject to any disclaimer, the term of this patent is extended or adjusted under 35 U.S.C. 154(b) by 27 days.

(21) Appl. No.: 15/591,161

(22) Filed: May 10, 2017

(65) Prior Publication Data

US 2018/0328986 A1    Nov. 15, 2018

(51) Int. Cl.
*G06F 11/00* (2006.01)
*G01R 31/317* (2006.01)

(52) U.S. Cl.
CPC ........ *G06F 11/00* (2013.01); *G01R 31/31705* (2013.01)

(58) Field of Classification Search
CPC .............................................. G01R 31/318555
USPC ....................................................... 714/727
See application file for complete search history.

(56) References Cited

U.S. PATENT DOCUMENTS

| | | | | |
|---|---|---|---|---|
| 4,744,571 A | * | 5/1988 | Geberth, Jr. | ......... F16J 15/3208 277/556 |
| 5,828,824 A | * | 10/1998 | Swoboda | ......... G01R 31/31705 714/25 |
| 7,216,276 B1 | * | 5/2007 | Azimi | .............. G01R 31/31705 714/30 |
| 2002/0133794 A1 | * | 9/2002 | Kanapathippillai | ........................ G01R 31/31705 716/136 |
| 2008/0010541 A1 | * | 1/2008 | Kudo | .................. G06F 11/3656 714/38.13 |
| 2013/0090887 A1 | * | 4/2013 | Deogharia | ....... G01R 31/31855 702/120 |
| 2017/0115348 A1 | * | 4/2017 | Schelle | ............ G01R 31/31703 |

* cited by examiner

*Primary Examiner* — Fritz Alphonse
(74) *Attorney, Agent, or Firm* — Viering, Jentschura & Partner MBB

(57) ABSTRACT

An electronic device includes one or more integrated circuits, a debugging translation block, and a bus connected to the one or more integrated circuits and the debugging translation block, the bus configured to provide a connection to one or more external devices, wherein the debugging translation block is configured to receive debugging commands from a testing host device via the bus, convert the debugging commands into debugging input data, and provide the debugging input data to a debugging state machine of a first integrated circuit of the one or more integrated circuits.

20 Claims, 11 Drawing Sheets

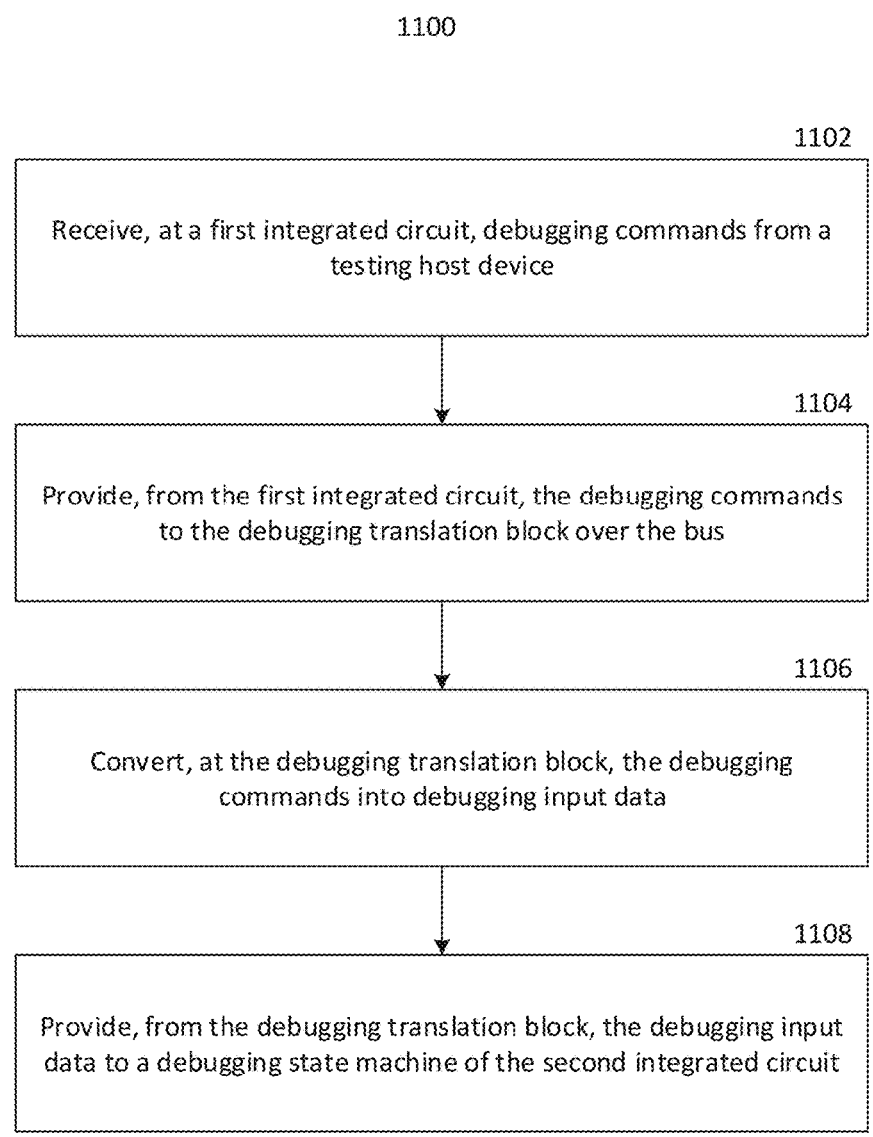

DEBUGGING TRANSLATION BLOCK AND DEBUGGING ARCHITECTURE

TECHNICAL FIELD

Various embodiments relate generally to debugging translation blocks and associated debugging architectures.

BACKGROUND

Many modern electronic chips undergo extensive debugging tests to identify and fix bugs and to increase reliability. Debugging protocols such as the Joint Test Action Group (JTAG) architecture have provided standardized systems that enable comprehensive debugging capabilities. JTAG and other similar debugging protocols generally call for the inclusion of various external pins on the periphery of a chip in addition to the inclusion of a debugging controller inside of the chip. A user or tester can then feed debugging test data and instructions to the internal debugging controller via the external pins. The debugging controller then passes the test data into the core logic of the chip according to the specified instructions and captures the output data. Evaluation of the output data can then assist in identifying bugs and other irregularities in the core logic.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 11 shows a first exemplary method for testing integrated circuits.

DESCRIPTION

Figure 1:
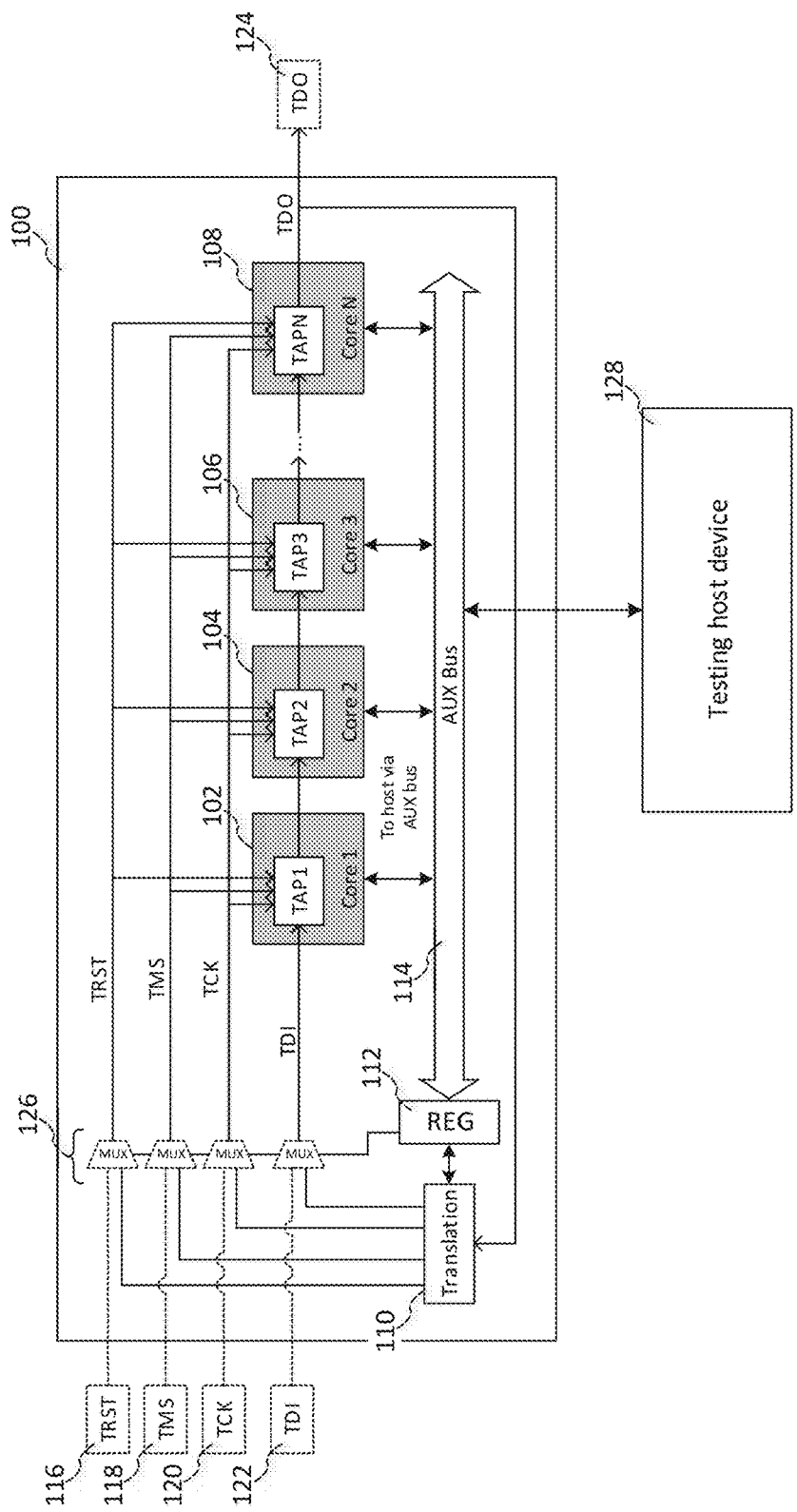
FIG. 1 shows an exemplary debugging architecture for cores of an electronic device according to some aspects.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The words "plurality" and "multiple" in the description or the claims expressly refer to a quantity greater than one. The terms "group (of)", "set [d]", "collection (of)", "series (of)", "sequence (of)", "grouping (of)", etc., and the like in the description or in the claims refer to a quantity equal to or greater than one, i.e. one or more. Any term expressed in plural form that does not expressly state "plurality" or "multiple" likewise refers to a quantity equal to or greater than one. The terms "proper subset", "reduced subset", and "lesser subset" refer to a subset of a set that is not equal to the set, i.e. a subset of a set that contains less elements than the set.

It is appreciated that any vector and/or matrix notation utilized herein is exemplary in nature and is employed solely for purposes of explanation. Accordingly, it is understood that the approaches detailed in this disclosure are not limited to being implemented solely using vectors and/or matrices, and that the associated processes and computations may be equivalently performed with respect to sets, sequences, groups, etc., of data, observations, information, signals, samples, symbols, elements, etc. Furthermore, it is appreciated that references to a "vector" may refer to a vector of any size or orientation, e.g. including a 1×1 vector (e.g. a scalar), a 1×M vector (e.g. a row vector), and an M×1 vector (e.g. a column vector). Similarly, it is appreciated that references to a "matrix" may refer to matrix of any size or orientation, e.g. including a 1×1 matrix (e.g. a scalar), a 1×M matrix (e.g. a row vector), and an M×1 matrix (e.g. a column vector).

A "circuit" as used herein is understood as any kind of logic-implementing entity, which may include special-purpose hardware or a processor executing software. A circuit may thus be an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions which will be described below in further detail may also be understood as a "circuit". It is understood that any two (or more) of the circuits detailed herein may be realized as a single circuit with substantially equivalent functionality, and conversely that any single circuit detailed herein may be realized as two (or more) separate circuits with substantially equivalent functionality. Additionally, references to a "circuit" may refer to two or more circuits that collectively form a single circuit. The term "circuit arrangement" may refer to a single circuit, a collection of circuits, and/or an electronic device composed of one or more circuits.

As used herein, "memory" may be understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component comprising one or more types of memory. It is readily understood that any single memory component may be separated into multiple collectively equivalent memory components, and vice versa. Furthermore, while memory may be depicted as separate from one or more other components (such as in the drawings), it is understood that memory may be integrated within another component, such as on a common integrated chip.

Unless explicitly specified, the term "transmit" encompasses both direct (point-to-point) and indirect transmission (via one or more intermediary points). Similarly, the term "receive" encompasses both direct and indirect reception. The term "communicate" encompasses one or both of transmitting and receiving, i.e. unidirectional or bidirectional communication in one or both of the incoming and outgoing directions. The term "calculate" encompass both 'direct' calculations via a mathematical expression/formula/relationship and 'indirect' calculations via lookup or hash tables and other array indexing or searching operations.

Many modern smartphones and wearables are designed and configured to support multiple different wireless technologies on a single comb chip. In conjunction with the rapidly decreasing scale of silicon technologies, the incorporation of hardware for multiple technologies places tight constraints on the amount of circuitry that can be placed on a single silicon chip. Accordingly, there may be very little or even no space to provide a debug interface on the final silicon product. However, as debugging capabilities can be very important in the production of high-reliability devices, there may still be a need to provide a debugging architecture.

According to aspects described herein, a debugging architecture can be implemented that supports comprehensive debugging capabilities without providing external debugging pins on the final silicon chip. As described herein, the debugging interface can be accessed via existing host and/or wireless links, and can thus provide a mechanism for manufacturers to enjoy extensive debugging support without sacrificing space on the final chip to include external debugging pins.

Although not so limited, various aspects of this disclosure can be implemented to support chip debugging architectures such as the Joint Test Action Group (JTAG) debugging standard. In JTAG and other similar debugging architectures, one or more input signals (e.g., bitstreams) are fed via external input pins into a chip, where they are received by a debugging state machine placed inside of the chip. Debugging test data and instructions are then fed into the debugging state machine via the one or more input signals, where the debugging state machine then delivers the test data into the chip core logic according to the instructions. The debugging state machine captures the resulting debugging output data and provides it as an output signal via an external output pin. By manipulating the test data and instruction inputs to the debugging state machine, a tester can run various debugging checks to verify whether the chip is operating correctly and, if not, identify bugs in the core logic of the chip.

In the exemplary case of JTAG, the JTAG state machine, known as a JTAG Test Access Port (TAP) controller, can include a data register and an instruction register. The JTAG input signals TDI, TCK, TMS, and TRST can then be toggled to various different values to feed different test data and instructions into the JTAG TAP controller, which will then push the test data into the chip core logic according to the instructions. The JTAG TAP controller then provides the resulting debugging output data from the chip core logic at the JTAG output signal TDO. This JTAG architecture provides for various JTAG operations, such as accessing core registers, auxiliary registers, closely coupled memory, cache, system memory, and peripherals. Separate external pins, or "PADs", are provided on JTAG-compatible chips to provide I/O access to the JTAG TAP controller included within the chips.

This JTAG architecture, originally standardized by the Institute of Electrical and Electronics Engineers (IEEE) in IEEE Standard 1149.1 in 1990 ("Standard Test Access Port and Boundary-Scan Architecture"), has become increasingly popular and is widely implemented in modern chip designs. However, JTAG and other similar debugging architectures are constrained by the fact that the JTAG-specific circuitry, including I/O pin support and the JTAG state machine, necessarily takes up space on the final chip product. Furthermore, once an individual JTAG-compatible chip is integrated as a component into a larger device (e.g., a wireless communication chip included in a laptop, smartphone, or other terminal device), the external JTAG pins can be difficult or impossible to access with a debugging device. This problem has become accentuated due to the increasingly minute scale of modern silicon chip designs, many of which may simply have too small of footprint to have sufficient space for external JTAG pins.

FIG. 1 shows an exemplary internal configuration of electronic device 100 according to some aspects of this disclosure. Without loss of generality, electronic device 100 is shown in FIG. 1 as having multiple cores 102, 104, 106, and 108, where each core may be a separate integrated circuitry component. Demonstrative examples include microprocessors, microcontrollers, ASICs, wireless communication controllers (e.g., Bluetooth, Wi-Fi, or a chip for another wireless communication protocol), or other type of integrated circuitry or processing component. The number of cores of electronic device 100 is scalable and may be any number from 1 to N, where N is a positive integer.

As shown in FIG. 1, cores 102-108 are each connected to AUX bus 114, which may be the master connection bus of electronic device 100. In addition to connecting to each of cores 102-108, AUX bus 114 also connects to various host devices for cores 102-108. For example, in some aspects core 102 may interface with a driver running on a host device (e.g., a processor), where the host device may interact with core 102 via the driver. AUX bus 114 may therefore provide an external connection to cores 102-108. During normal runtime operation, the host device may transfer commands and data to core 102 over AUX bus 114 via the driver. For example, if core 102 is a wireless communication controller (e.g., a Bluetooth controller, a Wi-Fi controller, or another type of wireless communication controller), a host device such as an application processor running a host application for core 102 may send commands (e.g., Attention (AT) commands) and data to core 102 over AUX bus 114, and core 102 may send back commands and data to the host device.

Cores 102-108 may be configured to support debugging according to a specific debugging protocol. Accordingly, cores 102-108 may respectively include TAP1, TAP2, TAP3, and TAPN, which may each be a debugging state machine.

TAP1-TAPN may therefore be logical circuitry components configured to receive input bitstreams that represent debugging test data and instructions and to progressively move through different states according to the debugging test data and instructions. In some aspects, TAP1-TAPN may include a controller and one or more registers, where the controller may read and write with the registers based on the test data and instructions and provide test data to the core logic of cores 102-108 to execute and capture the resulting output.

The various different states of TAP1-TAPN (e.g., according to the controller and registers), which can be controlled by toggling the input bitstreams to input different test data and instructions, can therefore result in different debugging operations that depend on the particular logic that defines the debugging state machine. TAP1-TAPN may provide input data to the core logic of cores 102-108 according to the debugging test data and execute different debugging operations according to the debugging instructions. TAP1-TAPN may then capture the resulting output data from the core logic and provide this output data as its output.

In aspects where electronic device 100 has multiple cores, TAP1-TAPN may be connected in a daisy-chain or bypass configuration. If connected in a daisy-chain configuration, TAP1 may provide its output data to TAP2, and which may then provide its output data to the next core (if any), and so forth from TAP2 on depending on the total number of cores in electronic device 100. Accordingly, the output data of one of TAP1-TAPN may serve as the input data to another of TAP1-TAPN. If connected in a bypass configuration, an additional logical circuitry arrangement of electronic device 100 connected as input to TAP1-TAPN may be configured to individually select one of TAP1-TAPN and to provide input data to the selected one of TAP1-TAPN without the input data passing through other of TAP1-TAPN. In aspects where electronic device 100 has only a single core (e.g., core 102), the output data from TAP1 may similar serve as its output without being provided as input to another debugging state machine.

The input data provided and output data produced by TAP1-TAPN may depend on the debugging architecture supported by TAP1-TAPN. For example, without loss of generality, in some aspects TAP1-TAPN may be JTAG state machines. Accordingly, TAP1-TAPN may receive the JTAG input signals TDI, TCK, TMS, and TRST as input data and produce the JTAG output signal TDO as output data. As defined the IEEE JTAG standard, TDI (Test Data Input) is a serial input data stream that is fed to the JTAG data register or JTAG instruction register, TMS (Test Mode Select) provides the inputs that control the state of the JTAG state machine, TCK (Test Clock) is the clock signal governing the JTAG state machine, TRST (Test Reset, which is optional) resets the JTAG state machine, and TDO (Test Data Out) is the resulting output from the JTAG state machine (which may be bypassed through as TDI or may be output by the core logic being tested).

As previously indicated, debugging architectures such as JTAG generally receive input signals and produce output signals via external pins, such as external pins mounted on a comb chip. A testing host device may then connect to these external pins during debugging to test the chip. However, size, device complexity, and accessibility constraints may render it difficult or impossible to provide the requisite external pins to support full debugging, in particular when the chips are in their final product form.

According to various aspects of this disclosure, electronic device 100 may utilize an advantageous architecture that avoids reliance on external pins while still providing comprehensive debugging support. As shown in FIG. 1, external device 100 may include debugging translation block 110 which interfaces with AUX bus 114 via register 110. Debugging translation block 110 may be configured to receive debugging commands from a testing host device via AUX bus 114, where the debugging commands can include operations such read operations, write operations, and shift operations. Debugging translation block 100 may then convert the debugging commands into equivalent debugging input data (e.g., test data and instructions) that complies with the low-level debugging bitstream protocol. Debugging translation block 110 may then provide the debugging input data to debugging state machines TAP1-TAPN. As the debugging input data may be in an equivalent format to the debugging input data conventionally provided via external pins (e.g., test data and instructions), TAP1-TAPN may then process the debugging input data in the same manner in order to execute the corresponding debugging instructions on the debugging test data. Debugging translation block 110 may then receive the resulting debugging output data and provide the debugging output data back to the host device via register 112 and AUX bus 114.

For example, in aspects using JTAG as the debugging architecture, debugging translation block 110 may be configured to receive debugging commands from a testing host device over AUX bus 114 and convert the debugging commands into the JTAG input signals TDI, TCK, TMS, and TRST. Debugging translation block 110 may then provide the TDI, TCK, TMS, and TRST input signals to JTAG state machines TAP1-TAPN, which may perform the corresponding JTAG debugging instructions with the JTAG test data as specified in the JTAG input signals. TAP1-TAPN may then produce JTAG output signal TDO (e.g., according to daisy-chain or bypass configuration connecting TAP1-TAPN), which debugging translation block 110 may receive and provide to the host device via AUX bus 114. As other debugging architectures similarly utilize low-level bitstreams to represent debugging test data and instructions, debugging translation block 110 can also be configured mutatis mutandis to perform analogous translation for other debugging architectures.

As debugging translation block 110 is configured to convert the debugging commands into equivalent debugging input data, the debugging architecture of electronic device 100 may offer the same level of comprehensive debugging as other solutions using external pins. Accordingly, aspects of this disclosure can avoid inclusion of external pins, thus conserving space and cost without sacrificing debugging functionality.

In some aspects, electronic device 100 may utilize a native configuration of AUX bus 114 to provide an interface between debugging translation block 110 and a testing host device. For example, auxiliary buses such as AUX bus 114 may generally provide a path for various cores to interface with their respective host devices, where, for example, a driver (e.g., a software or firmware program) running on a host device may communicate with a host interface (e.g., a hardware interface) of a core by exchanging data over an auxiliary bus. Accordingly, in the exemplary context of FIG. 1, core 102 may realize a logical connection with a counterpart host device by exchanging data (e.g., with its host interface) with a driver running on the host device.

Accordingly, electronic device 100 may utilize this existing connection framework to support the link between debugging translation block 110 and a testing host device to support debugging operations. As cores 102-108 are connected to AUX bus 114, and are capable of exchanging data with external host devices via AUX bus 114, one of cores 102-108 may act as a 'pipe' to route data to and from a testing host device. For example, in an exemplary scenario core 104 may be under test, and accordingly a user or tester may aim to debug core 104 according to the debugging standard supported by debugging translation block 110. The user may therefore aim to send debugging test data and instructions to TAP2 and to retrieve the resulting debugging output data after core 104 has processed the debugging test data.

In accordance with aspects provided herein, the user may be able to perform this debugging on core 104 by sending debugging commands to debugging translation block 110, which can then convert the debugging commands into equivalent debugging test data and instructions and provide the debugging test data and instructions to core 104. Accordingly, the user may connect testing host device 128 to electronic device 100, where testing host device 128 may include at least one processor executing a debugging application (e.g., by retrieval and execution of corresponding program code from a memory) that can communicate with core 102 with a logical connection realized via a driver of testing host device 128 and a host interface of core 102 over AUX bus 114. Core 102 may then act as a pipe connection to receive the debugging commands from testing host device 128, where the debugging application running on testing host device 128 sends the debugging commands (intended for debugging translation block 110) to core 102 over AUX bus 114 via the logical connection and core 102 forwards the debugging commands to debugging translation block 110 over AUX bus 114.

Core 102 may then feed the debugging commands into debugging translation block 110. Debugging translation block 110 may then convert the debugging commands into the debugging test data and instructions according to the supported debugging protocol and provide the debugging test data and instructions to TAP2 of core 104 (where core 104 is under test). TAP2 may perform the corresponding debugging instructions on the test data (e.g., as dictated by the logic of the debugging state machine) with the core logic of core 104 to produce the resulting debugging output data. In aspects where cores 102-108 are configured in a daisy-chain architecture, debugging translation block 110 may pass the debugging test data and instructions to core 104 through core 102, and/or may then receive the debugging output data produced by core 104 once it has passed through cores 106 and 108. In aspects where cores 102-108 are configured in a bypass architecture, debugging translation block 110 may provide the debugging test data and instructions to core 104 without passing it directly through core 102, and/or may obtain the debugging output data from core 104 without it passing through cores 106 and 108. Once debugging translation block 110 receives the debugging output data from core 104, debugging translation block 110 may provide the debugging output data to testing host device 128, for example, with core 102 again acting as a pipe to push the debugging output data to the debugging application of testing host device 128 over AUX bus 114.

In some aspects, debugging translation block 110 may be configured to perform debugging on a given core while the same core acts as a pipe to receive debugging commands from a testing host device. Accordingly, instead of, for example, core 102 acting as a pipe to transfer debugging output data and commands to and from testing host device 128 when debugging core 104, in some aspects debugging core 102 may act as a pipe connection to transfer debugging output data and commands to and from testing host device 128 when debugging core 102. While possible, in some scenarios this may be problematic as the debugging commands can include commands such as breakpoints and stepping at core 102, which can consequently disrupt the routing of the debugging output data and commands by core 102.

As shown in FIG. 1, in some aspects electronic device 100 may optionally also include debugging input pins 116, 118, 120, and 122, debugging output pin 124, and multiplexer array 126. Without loss of generality, these components are optional and therefore may or may not be included in electronic device 100. In aspects where these components are included, debugging input pins 116-122, debugging output pin 124, and multiplexer array 126 may provide a supplemental mechanism (in addition to debugging translation block 110) to perform debugging of cores 102-108. In particular, debugging input pins 116-122 and debugging output pin 124 may operate as standard external pins for debugging. Accordingly, a testing host device (which may be the same as or different from testing host device 128) can be connected to debugging input pins 116-122 and provide debugging test data and instructions to debugging input pins 116-122 according to the debugging protocol supported by cores 104-108. The testing host device can then also be connected to debugging output pin 124 to capture the resulting debugging output data.

As debugging input pins 116-122 can be provided in addition to debugging translation block 110, in some aspects electronic device 100 can also include multiplexer array 126. As shown in FIG. 1, multiplexer array 126 may receive input from both debugging inputs pins 116-122 and debugging translation block 110, where both inputs received at each of multiplexer array 126 may correspond to the same debugging input signal. Accordingly, if debugging input pins 116-122 are being used to debug one or more of cores 102-108, register 112 may provide a MUX selection signal that selects the input signals from debugging input pins 116-122 to be outputted from multiplexer array 126. Conversely, if the input signals provided by debugging translation block 110 are being used to debug one or more of cores 102-108, register 112 may provide a MUX selection signal that selects the input signals from debugging translation block 110 to be outputted from multiplexer array 126.

In some aspects, debugging input pins 116-122 and debugging output pin 124 may be provided as temporary components of electronic device 100. For example, debugging input pins 116-122 and debugging output pin 124 can be initially provided as part of electronic device 100 and then used for debugging during a design or development phase for electronic device 100. After the design or development phase is completed, debugging input pins 116-122 and debugging output pin 124 may be removed, and accordingly may not be included as part of electronic device 100 in its final product form. Once in its final product form, electronic device 100 may then be debugged using debugging translation block 110. In other aspects, debugging input pins 116-122 and debugging output pin 124 may be provided as permanent components of electronic device 100, and may be included in the final product form.

In aspects where cores 102-108 and debugging state machines TAP1-TAPN are configured for JTAG debugging, debugging input pin 116 may be a TRST input pin, debugging input pin 118 may be a TMS input pin, debugging input pin 120 may be a TCK input pin, debugging input pin 122 may be a TDI input pin, and debugging output pin 124 may be a TDO output pin. Multiplexer array 126 may therefore select between the JTAG input signals provided by input pins 116-122 and the JTAG input signals provided by debugging translation block 110 according to the MUX selection signal.

Electronic device 100 may therefore provide an advantageous configuration that supports pinless debugging. In particular, debugging translation block 110 may provide a mechanism accessible via an auxiliary bus that can load and unload the debugging state machines of the various cores of electronic device 100. As debugging translation block 110 can be accessed via AUX bus 114, electronic device 100 may be able to be debugged without having external debugging pins.

Figure 2:
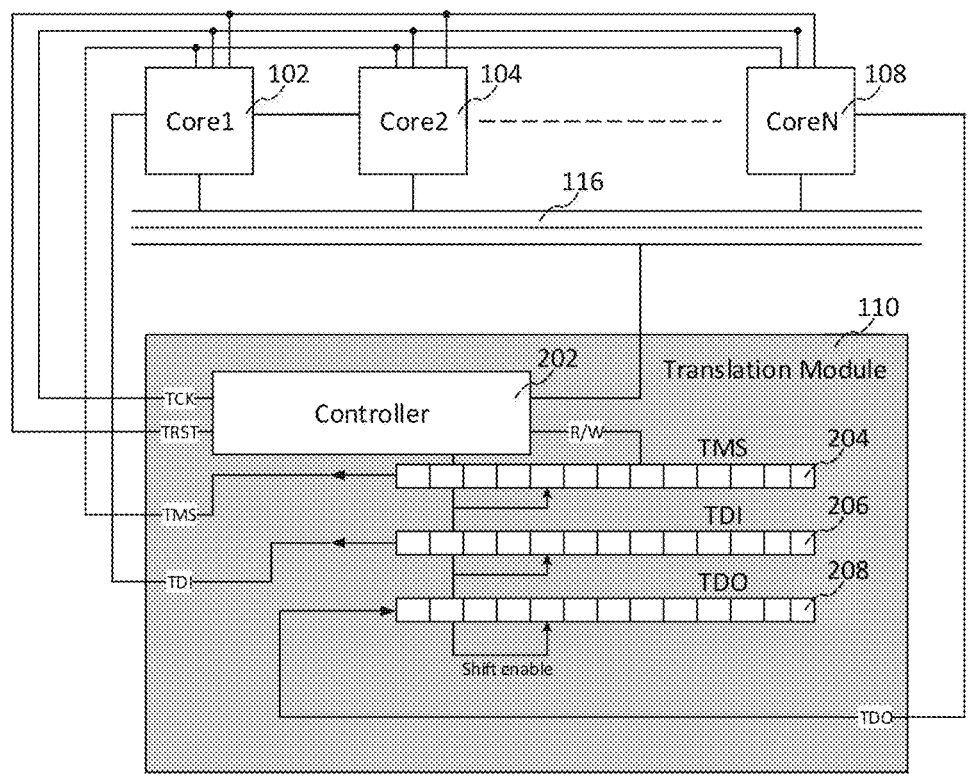
FIG. 2 shows an exemplary internal configuration for a debugging translation module according to some aspects.

FIG. 2 shows an exemplary internal configuration of debugging translation block 110 according to some aspects. As shown in FIG. 2, debugging translation block 110 may include controller 202 and registers 204-208. In some aspects, debugging translation block 110 may generally operate as a slave on AUX bus 114, where controller 202 may receive commands as input from AUX bus 114 and read from or write to registers 204-208 according to the commands. For example, in some aspects where cores 102-108 and debugging state machines TAP1-TAPN are configured for JTAG debugging, register 204 may be a TMS register, register 206 may be a TDI register, and register 208 may be a TDO register. The core that is currently operating the translation module, for example, that is acting as a pipe to provide debugging commands to debugging translation block 110, may receive the debugging commands on AUX bus 114 from testing host device 128 and provide the debugging commands to debugging translation block 110. For example, in an exemplary scenario where core 102 is operating debugging translation module 110, core 102 may trigger write commands at controller 202 to load TMS register 204 and TDI register 206 with the JTAG test data and instructions. Core 102 may likewise trigger read commands to read the JTAG output data from TDO register 208. In some aspects, controller 202 may also support a special write command that allows shifting the data in TMS register 204 and TDI register 206 in and shifting the data in TDO register 208 out for a configurable number of shift cycles. Upon receipt of a shift command on AUX bus 114, controller 202 may shift the data in TMS register 204 and TDI register 206 onto the TDI and TMS lines (and thus into cores 102-108 for processing by the core logic) for the specified number of shift cycles and shift the data from the TDO line into TDO shift register 208 for the specified number of shift cycles (and thus obtaining the resulting output data produced by the core logic). Controller 202 may also toggle the TCK line while shifting. The TRST line may be controlled directly from a register that is accessible from AUX bus 114.

Figure 3:
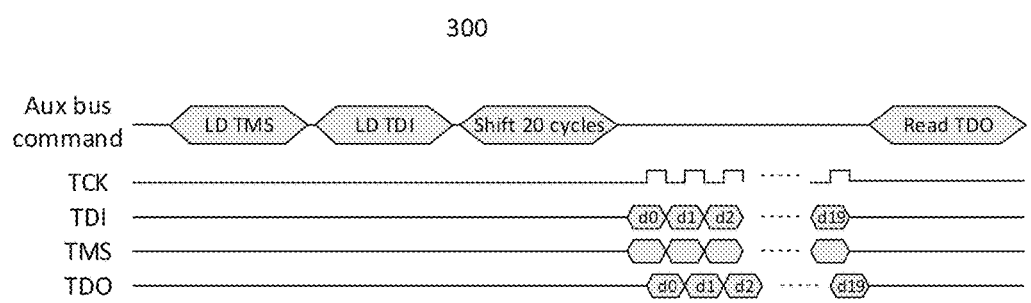
FIG. 3 shows an exemplary command sequence for a debugging translation module according to some aspects.

FIG. 3 shows an exemplary command sequence 300 as received by controller 202 on AUX bus 114 according to some aspects. As shown in FIG. 3, AUX bus 114 may provide a load TMS command, a load TDI command, a 20-cycle shift command, and a read TDO command. Accordingly, upon receipt of the load TMS command, controller 202 may load received TMS bits into TMS register 204. Similarly, upon receipt of the load TDI command, controller 202 may load received TDI bits into TDI register 206. Controller 202 may then shift the data loaded into TMS register 204 and TDI register 206 through cores 102-108 for 20 shift cycles (governed by 20 cycles of TCK) according to the 20-cycle shift command while loading TDO register 208 with the resulting TDO bits. Controller 202 may then read out TDO register 208 to AUX bus 114 according to the read TDO command. This exemplary sequence is demonstrative and may be applied to any combination of such commands received at controller 202 from AUX bus 114.

Figure 4:
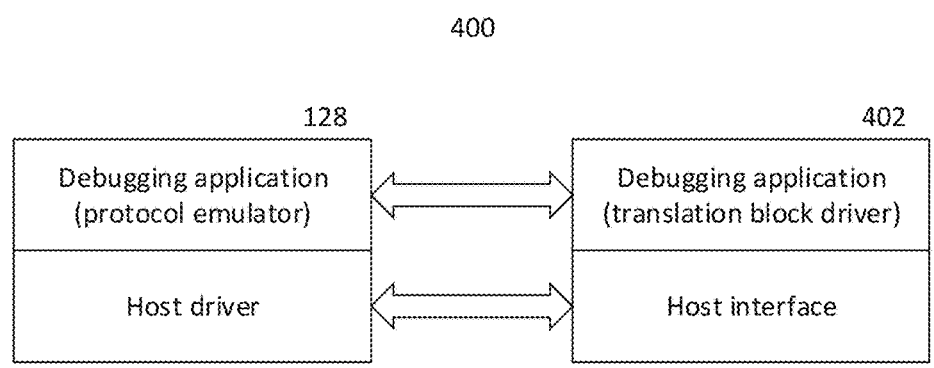
FIG. 4 shows an exemplary layer diagram depicting communication between a testing host device and core over a wired connection according to some aspects.

FIG. 4 shows an exemplary layer diagram 400 illustrating the communication between debugging translation block 110 and one of cores 102-108, such as core 102. As shown in FIG. 4, testing host device 128 may run a debugging application, such as by retrieving (e.g., from a memory) and executing program code that defines the logic of the debugging application as executable instructions. In some aspects, the debugging application may include protocol emulator functionalities that enable the debugging application to emulate the particular debugging protocol (e.g., JTAG or another debugging protocol) supported by electronic device 100. In particular, the debugging application may generate debugging commands that correspond to low-level debugging input data. The debugging application may then pass the debugging commands to the host driver of testing host device 128, which may then transmit the debugging commands to core 102 over AUX bus 118.

In particular, as previously described testing host device 128 may send the debugging commands to debugging translation block 110 via core 102 that is acting as a pipe between testing host device 128 and debugging translation block 110. The core acting as a pipe may then receive the debugging commands on AUX bus 118 via its host interface (configured to exchange data with the host deriver of testing host device 128) and obtain the debugging commands at the counterpart debugging application running on core 102. Core 102 may then provide the debugging commands to debugging translation block 110 over AUX bus 118 via the translation block driver of core 102. Debugging translation block 110 may then receive the debugging commands from AUX bus 118 and execute the debugging commands, such as in the manner of read, write, and shift commands as described above.

Aspects described above may utilize communication over an auxiliary bus (via a host driver and host interface) to send debugging commands and report debugging output data between a testing host device and a debugging translation block, where a core may act as a pipe connection to relay debugging commands and output data over the auxiliary bus. In other aspects of this disclosure, a debugging architecture may utilize a wireless link at one or more of the cores to transfer debugging commands and output data between a testing host device and a debugging translation block.

Figure 5:
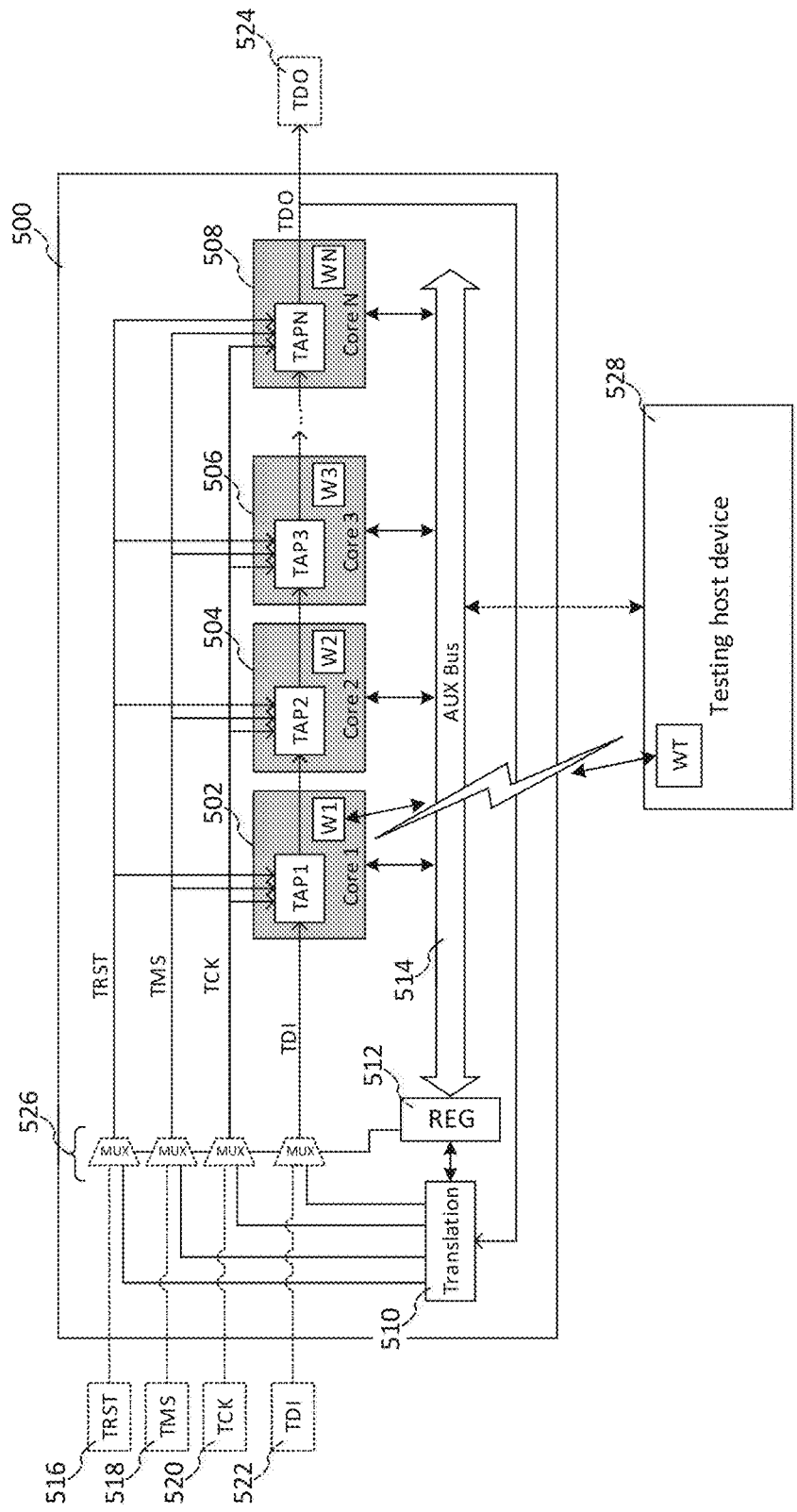
FIG. 5 shows an exemplary wireless debugging architecture for cores of an electronic device according to some aspects.

FIG. 5 shows an exemplary internal configuration of electronic device 500 according to some aspects. As shown in FIG. 5, electronic device 500 may be configured in a substantially similar manner to electronic device 100 as shown and described for FIG. 1. In particular, electronic device 500 may include cores 502-508, debugging translation block 510, register 512, AUX bus 514, and, optionally, debugging input pins 516-522 and debugging output pin 524. Similar to cores 102-108, cores 502-508 may include debugging state machines TAP1-TAPN, which may be configured to handle debugging test data and instructions according to a particular debugging protocol (e.g., JTAG or another debugging protocol).

As shown in FIG. 5, cores 502-508 may also include wireless chips W1, W2, W3, and WN, respectively. Although the demonstrative example of FIG. 5 shows that each of cores 502-508 has a wireless chip, these aspects are not so limited, and, accordingly, any one or more of cores 502-508 may include a wireless chip. Furthermore, while FIG. 5 depicts N=4 cores in electronic device 500, various aspects may include any number of cores from 1 to N, where N is a positive integer. In some aspects, cores 502-508 may be natively configured to include wireless chips W1-WN, or in other words, may include wireless chips W1-WN to support their native functionalities and not specifically to support debugging operations. In other aspects, wireless chips W1-WN may be deliberately provided to support debugging capabilities provided by debugging translation block 510.

In some aspects, one or more of cores 502-508 may utilize wireless chips W1-WN to transfer debugging commands and output data between a testing host device and debugging translation block 510. Accordingly, instead of (or in addition to) acting as a pipe to transfer debugging commands and output data over AUX bus 514 as in the case of FIG. 1, one or more of cores 502-508 may act as a pipe connection to wirelessly transfer debugging commands and output data between debugging translation block 510 and a testing host device using a wireless connection provided by W1-WN.

For example, core 504 may be under test, and core 502 may act as a pipe connection to relay debugging commands (for debugging core 504) to debugging translation block 110 from testing host device 528. As depicted in FIG. 5, core 502 may utilize W1 to wirelessly exchange data with testing host device 528. In particular, testing host device 528 may include wireless chip WT, which may be configured to wirelessly communicate with W1 of core 502. Accordingly, the debugging application running on testing host device 528 may provide debugging commands to wireless chip WT (e.g., instead of the host driver used to communicate with AUX bus 114 in the context of FIG. 1), which may then wirelessly transmit the debugging commands to W1 of core 102 over a wireless link. For example, if core 102 is a Wi-Fi controller, W1 may be a Wi-Fi chip. WT may also be a Wi-Fi chip, and may transmit and receive wireless data with W1 over a wireless Wi-Fi link. After receiving the debugging commands from WT, W1 may provide the debugging commands to TAP1, which may then feed the debugging commands to debugging translation block 510 over AUX bus 514. Debugging translation block 510 may then convert the debugging commands (e.g., read, write, and shift commands) into the corresponding debugging test data and instructions and provide debugging test data and instructions to TAP2 to debug core 504. After obtaining the resulting debugging output data from core 504, debugging translation block 510 may then provide the debugging output data back to core 502 over AUX bus 514. Core 502 may then wirelessly transmit the debugging output data to testing host device 528 with W1.

Figure 6:
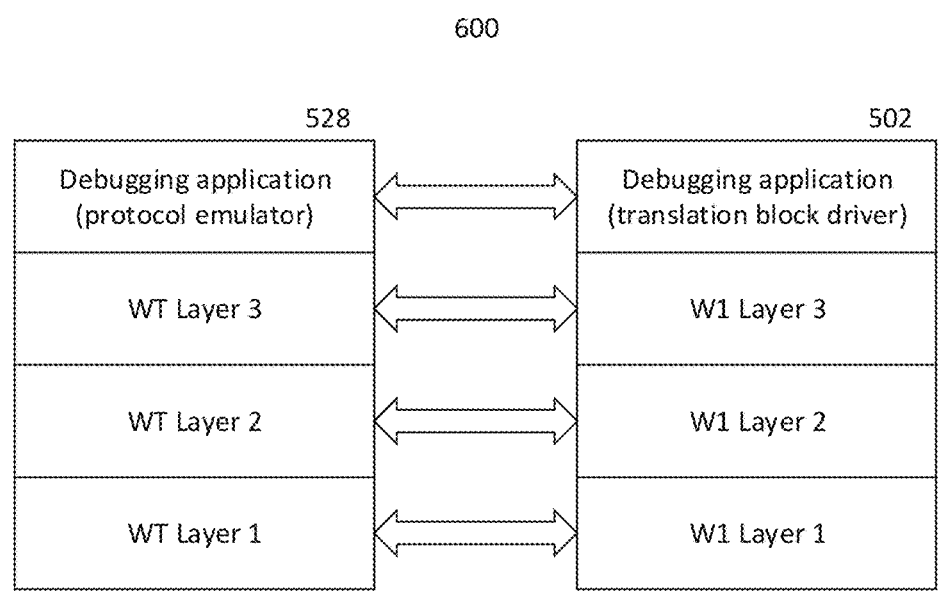
FIG. 6 shows an exemplary layer diagram depicting communication between a testing host device and core over a wireless connection according to some aspects.

FIG. 6 shows an exemplary layer diagram 600 illustrating the communication between debugging translation block 510 and core 502. In a substantially similar manner as shown and described for FIG. 4, testing host device 528 may execute a debugging application, which may generate debugging commands according to protocol emulation techniques. The debugging application may then provide the debugging commands to WT for wireless transmission. The various protocol layers of WT, including Layer 3, Layer 2, and Layer 1, may then receive and process the debugging commands according to their respective layer-specific processing responsibilities to prepare the debugging commands for wireless transmission. Layer 1 of WT may then wirelessly transmit the debugging commands (as Layer 1 signaling) to Layer 1 of W1, which may then revert the layer-specific processing from WT at the counterpart layers of W1 to recover the original debugging commands generated by the debugging application of testing host device 528. The counterpart debugging application at core 502 may then output the debugging commands via the translation block driver of core 502 to provide the debugging commands to debugging translation block 510 over AUX bus 514. Debugging translation block 510 may then execute the debugging commands to debug core 504.

In exemplary Bluetooth context, core 502 may be a Bluetooth controller, and WT and W1 may be Bluetooth chips. The debugging application of testing host device 528 may therefore provide the debugging commands to the Bluetooth protocol stack for WT, which may then process the debugging commands according to the layer-specific Bluetooth protocol functions (e.g., RFCOMM and Service Discover Protocol (SDP) for Bluetooth Layer 3, LMP and L2CAP for Bluetooth Layer 2, and Baseband for Bluetooth Layer 1) and transmit the debugging commands as Bluetooth signals via WT. W1 may then receive the Bluetooth signals and revert the layer-specific Bluetooth protocol functions to obtain the original debugging commands at its debugging application, and subsequently provide the debugging commands via its translation block driver to debugging translation block 510 over AUX bus 518.

While the physical connection between core 502 and testing host device 528 may be wireless (via W1 and WT) instead of wired, in some aspects the remaining functionality of debugging translation block 510 and cores 502-508 may be substantially the same to that of debugging translation block 110 and cores 102-108. Accordingly, in some aspects debugging translation block 510 can be configured in the manner as shown and described for debugging translation block 110 in FIGS. 2 and 3. Furthermore, in some aspects electronic device 500 may be configured to support both wired links with testing host device 528 over AUX bus 514 and wireless links with testing host device 528 via one or more wireless chips, while in other aspects electronic device 500 may be configured to support only wireless links with testing host device 528 via one or more wireless chips. In some aspects, the optional debugging input pins 516-522, debugging output pin 524, and multiplexer array 526 may be included as part of electronic device 500, such as either temporary (e.g., removed in the final product form) or permanent (e.g., included in the final product form) components, while in other aspects debugging input pins 516-522, debugging output pin 524, and multiplexer array 526 may not be included as part of electronic device 500.

A user or tester may therefore be able to debug the various cores of an electronic device by interacting with a debugging translation block through a debugging application executed on a testing host device. Debugging translation blocks may therefore enable the use of an application program interface (API) for the debugging application layer, and may convert the upper-layer API commands (debugging commands) into debugging test data and instructions. The user may therefore be able to issue upper-layer debugging commands according to this API to perform a variety of debugging operations on the cores of an electronic device, including, for example, access to core and auxiliary registers, closely-coupled memory, caches, system memory, and peripherals.

In addition to providing a system for pinless debugging, aspects presented herein can also provide layered security functions. For example, many existing debugging architectures allow relatively unrestricted access to the internal components that are being debugged, and accordingly to not provide strong limitations on who can access the internal debugging architecture of a chip.

Figure 7:
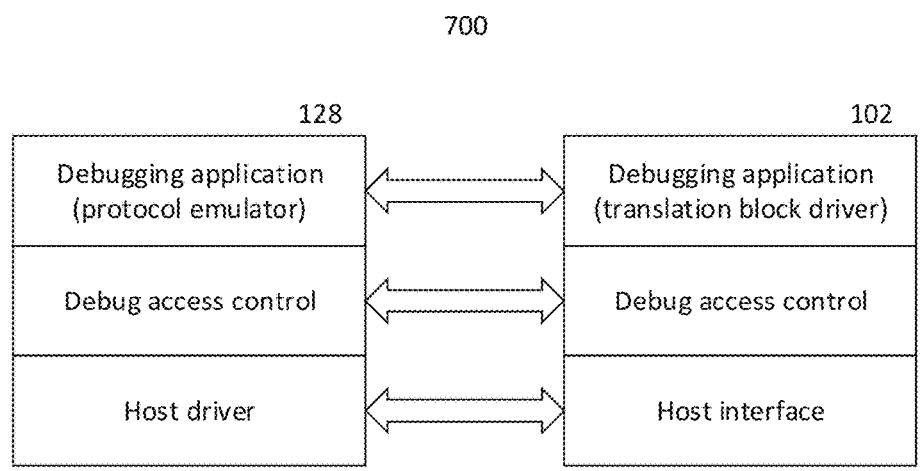
FIG. 7 shows an exemplary layer diagram depicting communication between a testing host device and core over a wired connection with a debug access control layer according to some aspects.
Figure 8:
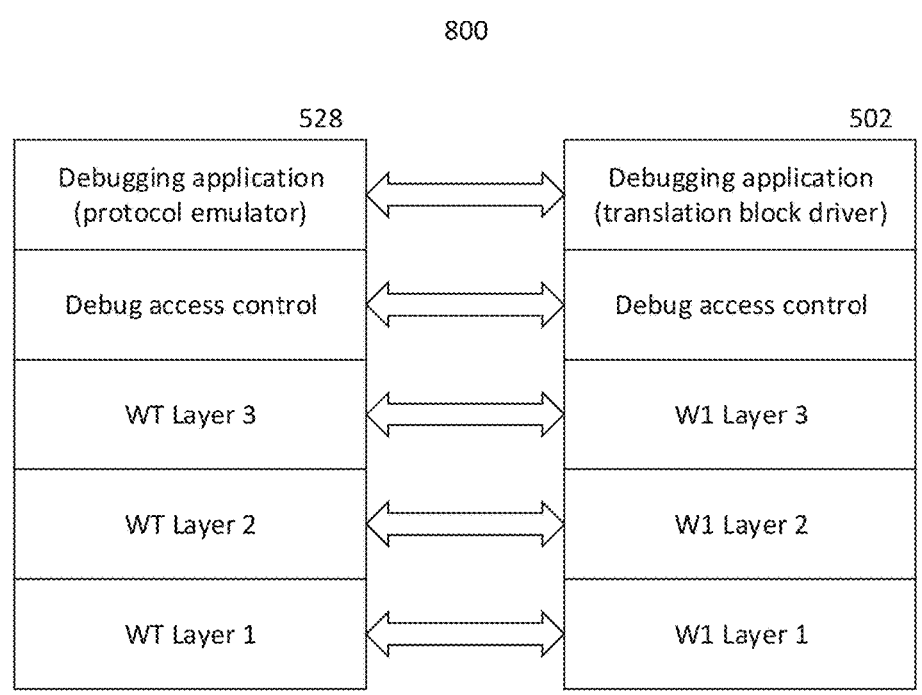
FIG. 8 shows an exemplary layer diagram depicting communication between a testing host device and core over a wireless connection with a debug access control layer according to some aspects.

Accordingly, aspects of this disclosure can also provide a debug access control layer that provides extra security and controls who is able to access the debugging functions provided by the debugging translation block. In particular, the debug access control layer may be provided between the debugging application layer and the transfer layers (e.g., used for wired or wireless transmission). FIGS. 7 and 8 show exemplary layer diagrams 700 and 800, where layer diagram 700 depicts the layer arrangement for wired debugging access (e.g., via AUX bus 114) and layer diagram 800 depicts the layer arrangement for wireless debugging access (e.g., via wireless chips W1-WN and WT). As shown in layer diagrams 700 and 800, a debug access control layer may be provided directly under the debugging application layer for both the core and testing host device. For example, when the debugging application is running on the testing host device (e.g., testing host device 128 or 528), the debug access control layer may unlock debugging capabilities based on a debug key provided as input to the debugging application. Accordingly, the debugging application running at the test host device may prompt a user for a debug key (e.g., via an input/output system of the testing host device), and may provide no access or very limited access to the debug functionalities before a valid debug key is provided. If the user provides a valid debug key, the debugging application may grant access to the debugging functionalities, and accordingly may allow the user to input debugging commands (e.g., high-level API commands). The debugging application may then transfer the debugging commands to the counterpart debugging application running on the core which is acting as a pipe, which may also pass through a counterpart debug access control layer of the core that also verifies whether a valid debug key has been provided. The counterpart debugging application at the core may then provide the debugging commands to the debugging translation block via the translation block driver, and report debugging output data back to the debugging application of the testing host device via the reverse path.

The debug access control layer may therefore be responsible for exchanging and verifying the debug key to enable debug capabilities. In some aspects, the debug access control layer can be implemented as software running beneath the debugging application. In some aspects, the debug access control layer can be implemented at the debugging translation block with a one-time programmable memory (e.g., electrically erasable programmable read-only memory (EEPROM)), which can prevent the debugging translation layer from doing any bit toggling (e.g., to provide debugging test data and instructions) unless unlocked with a valid debug key. In other aspects, the debug access control layer can be connected to the processors running the debugging application, and can have the same security limitations. In some aspects, the translation layer of the debugging translation block can locally handle access requests, such as by examining transactions and deciding what is permitted and what is denied. For example, if there is a debugging command that access a memory address that is restricted, the debugging translation layer could block the debugging command.

In some aspects, the debug access control layer may also be configured with a leveled security scheme, where certain debug keys provide full access to the debugging capabilities and other debug keys only provide limited access to debugging capabilities. Accordingly, parties that are provided with the full-access debug key can be permitted access to the full debugging capabilities while other parties that only have limited-access debug key may not be able to access the entire suite of debugging capabilities.

Figure 9:
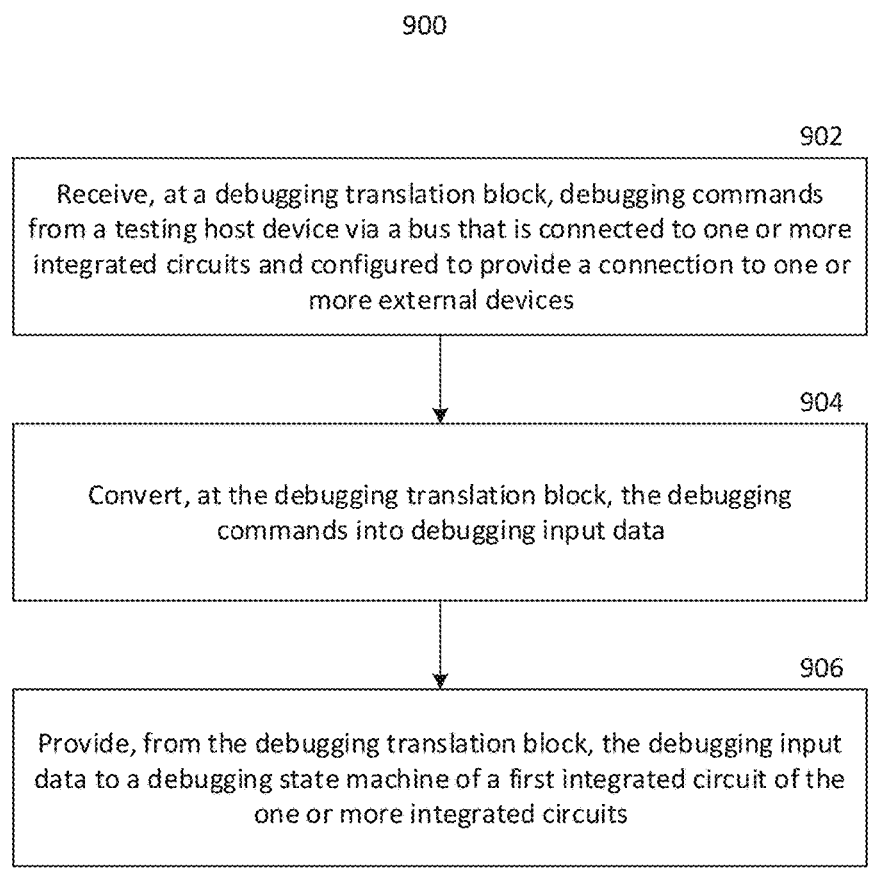
FIG. 9 shows a first exemplary method for testing integrated circuits.

FIG. 9 shows method 900 for testing integrated circuits. As shown in FIG. 9, method 900 includes receiving, at a debugging translation block, debugging commands from a testing host device via a bus that is connected to one or more integrated circuits and configured to provide a connection to one or more external devices (902), converting, at the debugging translation block, the debugging commands into debugging input data (904), and providing, from the debugging translation block, the debugging input data to a debugging state machine of a first integrated circuit of the one or more integrated circuits (906).

Figure 10:
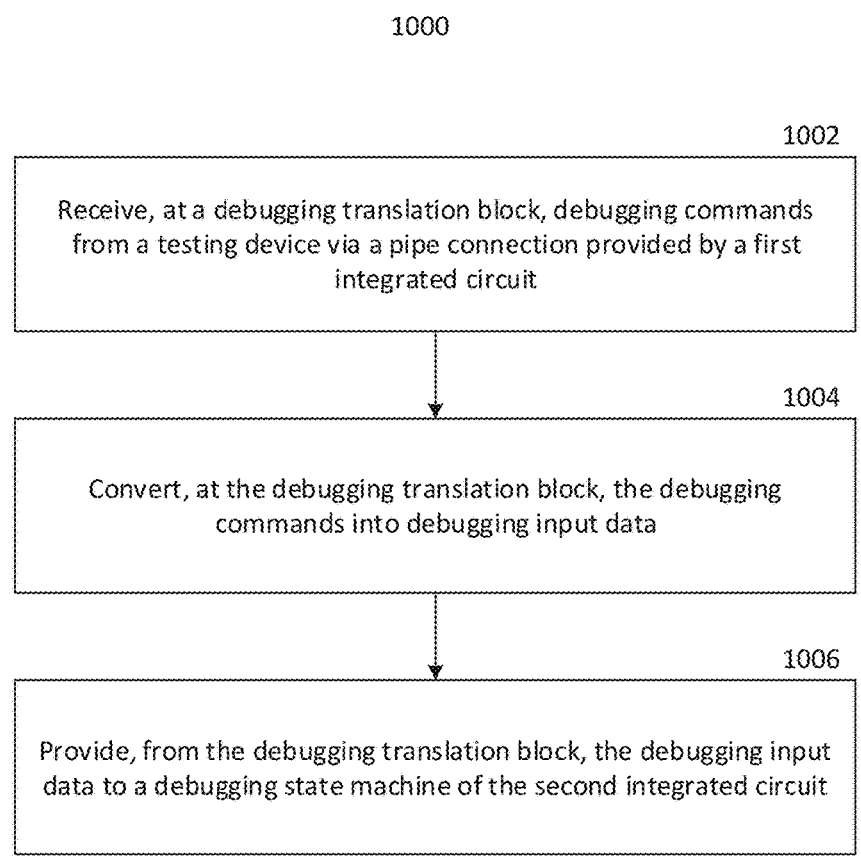
FIG. 10 shows a first exemplary method for testing integrated circuits.

FIG. 10 shows method 1000 for testing integrated circuits. As shown in FIG. 10, method 1000 includes receiving, at a debugging translation block, debugging commands from a testing device via a pipe connection provided by a first integrated circuit (1002), converting, at the debugging translation block, the debugging commands into debugging input data (1004), and providing, from the debugging translation block, the debugging input data to a debugging state machine of the second integrated circuit (1006).

FIG. 11 shows method 1100 for testing integrated circuits. As shown in FIG. 11, method 1100 includes receiving, at a first integrated circuit, debugging commands from a testing host device (1102), providing, from the first integrated circuit, the debugging commands to the debugging translation block over the bus (1104), converting, at the debugging translation block, the debugging commands into debugging input data (1106), and providing, from the debugging translation block, the debugging input data to a debugging state machine of a second integrated circuit (1108).

In one or more further exemplary aspects of the disclosure, one or more of the features described above in reference to FIGS. 1-15 may be further incorporated into method 900, 1000, and/or 1100. In particular, in some aspects method 900, 1000, and/or 1100 may include further and/or alternate processes as shown and detailed herein for electronid device 100.

The terms "user equipment", "UE", "mobile terminal", "user terminal", "terminal device", etc., may apply to any wireless communication device, including cellular phones, tablets, laptops, personal computers, wearables, multimedia playback and other handheld electronic devices, consumer/home/office/commercial appliances, vehicles, and any number of additional electronic devices capable of wireless communications.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

The following examples pertain to further aspects of this disclosure:

Example 1 is an electronic device including one or more integrated circuits, a debugging translation block, and a bus connected to the one or more integrated circuits and the debugging translation block, the bus configured to provide a connection to one or more external devices, wherein the debugging translation block is configured to receive debugging commands from a testing host device via the bus, convert the debugging commands into debugging input data, and provide the debugging input data to a debugging state machine of a first integrated circuit of the one or more integrated circuits.

In Example 2, the subject matter of Example 1 can optionally include wherein a second integrated circuit of the one or more integrated circuits is configured to receive the debugging commands from the testing host device over the bus via a wired connection, and to provide the debugging commands to the debugging translation block over the bus.

In Example 3, the subject matter of Example 2 can optionally include wherein the debugging translation block is configured to receive debugging output data from the first integrated circuit, and to provide the debugging output data to the testing host device over the bus via the wired connection.

In Example 4, the subject matter of Example 1 can optionally include wherein a second integrated circuit of the one or more integrated circuits is configured to receive the debugging commands from the testing host device via a wireless connection, and to provide the debugging commands to the debugging translation block over the bus.

In Example 5, the subject matter of Example 4 can optionally include wherein the second integrated circuit includes a wireless communication chip that is configured to wirelessly receive the debugging commands from the testing host device via the wireless connection.

In Example 6, the subject matter of Example 4 or 5 can optionally include wherein the second integrated circuit is a wireless controller.

In Example 7, the subject matter of any one of Examples 4 to 6 can optionally include wherein the debugging translation block is configured to receive debugging output data from the first integrated circuit, and to provide the debugging output data to the testing host device via the wireless connection.

In Example 8, the subject matter of any one of Examples 1 to 7 can optionally include wherein the debugging input data includes debugging test data and debugging instructions, and wherein the debugging translation block is configured to provide the debugging test data and the debugging instructions to the debugging state machine of the first integrated circuit by providing the debugging test data and debugging instructions over a plurality of debugging signal lines.

In Example 9, the subject matter of Example 8 can optionally include wherein the debugging input data is Joint Test Action Group (JTAG) input data, the debugging state machine is a JTAG TAP controller, and the plurality of debugging signal lines include one or more of a Test Reset (TSRT) signal line, a Test Mode Select (TMS) signal line, a Test Clock (TCLK) signal line, or a Test Data Input (TDI) signal line.

In Example 10, the subject matter of any one of Examples 1 to 9 can optionally include wherein the bus is an auxiliary bus of the electronic device.

In Example 11, the subject matter of any one of Examples 1 to 7 can optionally include wherein the one or more integrated circuits are a plurality of integrated circuits.

In Example 12, the subject matter of Example 11 can optionally include wherein the plurality of integrated circuits are arranged in a bypass configuration for debugging.

In Example 13, the subject matter of Example 11 can optionally include wherein the plurality of integrated circuits are arranged in a daisy-chain configuration for debugging.

In Example 14, the subject matter of any one of Examples 1 to 13 can optionally include wherein the debugging translation block is configured to grant access to debugging capabilities based on whether a valid debug key is provided.

In Example 15, the subject matter of any one of Examples 1 to 13 can optionally include wherein the debugging translation block is configured to grant access to different levels of debugging capabilities based on which of a plurality of valid debug keys is provided.

In Example 16, the subject matter of any one of Examples 1 to 15 can optionally further include a multiplexer, wherein the multiplexer is configured to receive a first input from the debugging translation block and a second input from an external pin, and to provide either the first input or the second input as output to the debugging state machine based on a multiplexer selection signal.

In Example 17, the subject matter of Example 15 can optionally include wherein the multiplexer is one of a plurality of multiplexers each configured to select between a first input from the debugging translation block and a second input from an external pin, and to provide either the first input or the second input as output to the debugging state machine based on a multiplexer selection signal.

In Example 18, the subject matter of any one of Examples 1 to 17 can optionally include wherein the debugging state machine includes one or more registers configured to shift debugging test data into logic circuitry of the first integrated circuit and to capture debugging output data from the logic circuitry.

In Example 19, the subject matter of any one of Examples 1 to 18 can optionally include wherein the debugging translation block includes a controller and one or more registers, wherein the controller is configured to read and write from the one or more registers based on the debugging commands.

In Example 20, the subject matter of any one of Examples 1 to 19 can optionally include wherein the debugging input data is Joint Test Action Group (JTAG) input data and the debugging state machine is a JTAG TAP controller.

In Example 21, the subject matter of any one of Examples 1 to 20 can optionally include wherein the debugging input data includes Test Reset (TRST) data, Test Mode Select (TMS) data, Test Clock (TCK) data, or Test Data Input (TDI) data.

Example 22 is an electronic device including a first integrated circuit and second integrated circuit, and a debugging translation block configured to receive debugging commands from a testing host device via a pipe connection provided by the first integrated circuit, convert the debugging commands into debugging input data, and to provide the debugging input data to a debugging state machine of the second integrated circuit.

In Example 23, the subject matter of Example 22 can optionally further include a bus that connects the first integrated circuit and the debugging translation block, wherein the first integrated circuit is configured to provide the pipe connection over the bus.

In Example 24, the subject matter of Example 23 can optionally include wherein the first integrated circuit is configured to provide the pipe connection as a wired connection over the bus to the testing host device.

In Example 25, the subject matter of Example 22 can optionally include wherein the first integrated circuit includes a wireless chip configured to provide the pipe connection as a wireless connection with a counterpart wireless chip of the testing host device.

In Example 26, the subject matter of Example 25 can optionally further include a bus that connects the first integrated circuit and the debugging translation block, wherein the first integrated circuit is configured to receive the debugging commands via the wireless chip and to send the debugging commands to the debugging translation block over the bus.

In Example 27, the subject matter of Example 25 or 26 can optionally include wherein the first integrated circuit is a wireless controller.

In Example 28, the subject matter of any one of Examples 23 to 24 or 26 to 27 can optionally include wherein the bus is an auxiliary bus of the electronic device.

In Example 29, the subject matter of any one of Examples 22 to 27 can optionally include wherein the debugging input data includes debugging test data and debugging instructions, and wherein the debugging translation block is configured to provide the debugging test data and the debugging instructions to the debugging state machine of the second integrated circuit by providing the debugging test data and debugging instructions over a plurality of debugging signal lines.

In Example 30, the subject matter of Example 29 can optionally include wherein the debugging input data is Joint Test Action Group (JTAG) input data, the debugging state machine is a JTAG TAP controller, and the plurality of debugging signal lines include one or more of a Test Reset (TSRT) signal line, a Test Mode Select (TMS) signal line, a Test Clock (TCLK) signal line, or a Test Data Input (TDI) signal line.

In Example 31, the subject matter of any one of Examples 22 to 30 can optionally include wherein the first integrated circuit and the second integrated circuit are arranged in a bypass configuration for debugging.

In Example 32, the subject matter of any one of Examples 22 to 30 can optionally include wherein the first integrated circuit and the second integrated circuit are arranged in a daisy-chain configuration for debugging.

In Example 33, the subject matter of any one of Examples 22 to 32 can optionally include wherein the debugging translation block is configured to grant access to debugging capabilities based on whether a valid debug key is provided.

In Example 34, the subject matter of any one of Examples 22 to 32 can optionally include wherein the debugging translation block is configured to grant access to different levels of debugging capabilities based on which of a plurality of valid debug keys is provided.

In Example 35, the subject matter of any one of Examples 22 to 34 can optionally further include a multiplexer, wherein the multiplexer is configured to receive a first input from the debugging translation block and a second input from an external pin, and to provide either the first input or the second input as output to the debugging state machine based on a multiplexer selection signal.

In Example 36, the subject matter of Example 35 can optionally include wherein the multiplexer is one of a plurality of multiplexers each configured to select between a first input from the debugging translation block and a second input from an external pin, and to provide either the first input or the second input as output to the debugging state machine based on a multiplexer selection signal.

In Example 37, the subject matter of any one of Examples 22 to 36 can optionally include wherein the debugging state machine includes one or more registers configured to shift debugging test data into logic circuitry of the first integrated circuit, and to capture debugging output data from the logic circuitry.

In Example 38, the subject matter of any one of Examples 22 to 37 can optionally include wherein the debugging translation block includes a controller and one or more registers, wherein the controller is configured to read and write from the one or more registers based on the debugging commands.

In Example 39, the subject matter of any one of Examples 22 to 38 can optionally include wherein the debugging input data is Joint Test Action Group (JTAG) input data and the debugging state machine is a JTAG TAP controller.

In Example 40, the subject matter of any one of Examples 22 to 39 can optionally include wherein the debugging input data includes Test Reset (TRST) data, Test Mode Select (TMS) data, Test Clock (TCK) data, or Test Data Input (TDI) data.

Example 41 is an electronic device including a first integrated circuit and a second integrated circuit, a debugging translation block, and a bus connecting the first integrated circuit and the debugging translation block, wherein the first integrated circuit is configured to receive debugging commands from a testing host device and to provide the debugging commands to the debugging translation block over the bus, and the debugging translation block is configured to convert the debugging commands into debugging input data and to provide the debugging input data to a debugging state machine of the second integrated circuit.

In Example 42, the subject matter of Example 41 can optionally further include a plurality of signal lines connecting the debugging translation block and the debugging state machine, wherein the debugging translation block is configured to provide the debugging input data to the debugging state machine on the plurality of signal lines.

In Example 43, the subject matter of Example 42 can optionally include wherein the debugging input data includes Joint Test Action Group (JTAG) input data, and the plurality of signal lines include a Test Mode Select (TMS) signal line, a Test Clock (TCK) signal line, and a Test Data Input (TDI) signal line.

In Example 44, the subject matter of any one of Examples 41 to 43 can optionally include wherein the debugging translation block includes one or more registers and the debugging state machine includes one or more registers, and wherein the one or more registers of the debugging translation block are configured to push the debugging input data to the one or more registers of the debugging state machine according to the debugging commands.

In Example 45, the subject matter of Example 44 can optionally include wherein the debugging input data includes Joint Test Action Group (JTAG) input data, and wherein the one or more registers of the debugging translation block include a Test Mode Select (TMS) register or a Test Data Input (TDI) register.

In Example 46, the subject matter of any one of Examples 41 to 45 can optionally include wherein the first integrated circuit is configured to receive the debugging commands from the testing host device over the bus via a wired connection, and to provide the debugging commands to the debugging translation block over the bus.

In Example 47, the subject matter of any one of Examples 41 to 45 can optionally include wherein the first integrated circuit is configured to receive the debugging commands from the testing host device via a wireless connection, and to provide the debugging commands to the debugging translation block over the bus.

In Example 48, the subject matter of Example 47 can optionally include wherein the first integrated circuit includes a wireless communication chip that is configured to wirelessly receive the debugging commands from the testing host device via the wireless connection.

In Example 49, the subject matter of Example 47 or 48 can optionally include wherein the first integrated circuit is a wireless controller.

In Example 50, the subject matter of any one of Examples 41 to 49 can optionally include wherein the bus is an auxiliary bus of the electronic device.

In Example 51, the subject matter of any one of Examples 41 to 50 can optionally include wherein the debugging translation block is configured to receive debugging output data from the first integrated circuit, and to provide the debugging output data to the testing host device via the bus.

In Example 52, the subject matter of any one of Examples 41 to 51 can optionally include wherein the first integrated circuit and the second integrated circuit are arranged in a bypass configuration for debugging.

In Example 53, the subject matter of any one of Examples 41 to 52 can optionally include wherein the first integrated circuit and the second integrated circuit are arranged in a daisy-chain configuration for debugging.

In Example 54, the subject matter of any one of Examples 41 to 53 can optionally include wherein the debugging translation block is configured to grant access to debugging capabilities based on whether a valid debug key is provided.

In Example 55, the subject matter of any one of Examples 41 to 53 can optionally include wherein the debugging translation block is configured to grant access to different levels of debugging capabilities based on which of a plurality of valid debug keys is provided.

In Example 56, the subject matter of any one of Examples 41 to 55 can optionally further include a multiplexer, wherein the multiplexer is configured to receive a first input from the debugging translation block and a second input from an external pin, and to provide either the first input or the second input as output to the debugging state machine based on a multiplexer selection signal.

In Example 57, the subject matter of Example 56 can optionally include wherein the multiplexer is one of a plurality of multiplexers each configured to select between a first input from the debugging translation block and a second input from an external pin, and to provide either the first input or the second input as output to the debugging state machine based on a multiplexer selection signal.

In Example 58, the subject matter of any one of Examples 41 to 57 can optionally include wherein the debugging state machine includes one or more registers configured to shift debugging test data into logic circuitry of the first second circuit and to capture debugging output data from the logic circuitry.

In Example 59, the subject matter of any one of Examples 41 to 58 can optionally include wherein the debugging translation block includes a controller and one or more registers, wherein the controller is configured to read and write from the one or more registers based on the debugging commands.

In Example 60, the subject matter of any one of Examples 41 to 59 can optionally include wherein the debugging input data is Joint Test Action Group (JTAG) input data and the debugging state machine is a JTAG TAP controller.

Example 61 is a method for testing integrated circuits, the method including receiving, at a debugging translation block, debugging commands from a testing host device via a bus that is connected to one or more integrated circuits and configured to provide a connection to one or more external devices, converting, at the debugging translation block, the debugging commands into debugging input data, and providing, from the debugging translation block, the debugging input data to a debugging state machine of a first integrated circuit of the one or more integrated circuits.

Example 62 is a method for testing integrated circuits, the method including receiving, at a debugging translation block, debugging commands from a testing device via a pipe connection provided by a first integrated circuit, converting, at the debugging translation block, the debugging commands into debugging input data, and providing, from the debugging translation block, the debugging input data to a debugging state machine of the second integrated circuit.

Example 63 is a method for testing integrated circuits, the method including receiving, at a first integrated circuit, debugging commands from a testing host device, providing, from the first integrated circuit, the debugging commands to the debugging translation block over the bus, converting, at the debugging translation block, the debugging commands into debugging input data, and providing, from the debugging translation block, the debugging input data to a debugging state machine of a second integrated circuit.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic device comprising:
    one or more integrated circuits;
    a debugging translation block; and
    a bus connected to the one or more integrated circuits and the debugging translation block, the bus configured to provide a connection to one or more external devices;
    wherein the debugging translation block is configured to receive debugging commands from a testing host device via the bus, convert the debugging commands into debugging input data, and provide the debugging input data to a debugging state machine of a first integrated circuit of the one or more integrated circuits,
    wherein the debugging input data comprises debugging test data and debugging instructions, and wherein the debugging translation block is configured to provide the debugging test data and the debugging instructions to the debugging state machine of the first integrated circuit by providing the debugging test data and debugging instructions over a plurality of debugging signal lines.

2. The electronic device of claim 1, wherein a second integrated circuit of the one or more integrated circuits is configured to receive the debugging commands from the testing host device over the bus via a wired connection, and to provide the debugging commands to the debugging translation block over the bus.

3. The electronic device of claim 2, wherein the debugging translation block is configured to receive debugging output data from the first integrated circuit, and to provide the debugging output data to the testing host device over the bus via the wired connection.

4. The electronic device of claim 1, wherein a second integrated circuit of the one or more integrated circuits is configured to receive the debugging commands from the testing host device via a wireless connection, and to provide the debugging commands to the debugging translation block over the bus.

5. The electronic device of claim 4, wherein the second integrated circuit comprises a wireless communication chip that is configured to wirelessly receive the debugging commands from the testing host device via the wireless connection.

6. The electronic device of claim 4, wherein the second integrated circuit is a wireless controller.

7. The electronic device of claim 4, wherein the debugging translation block is configured to receive debugging output data from the first integrated circuit, and to provide the debugging output data to the testing host device via the wireless connection.

8. The electronic device of claim 1, wherein the debugging input data is Joint Test Action Group (JTAG) input data, the debugging state machine is a JTAG TAP controller, and the plurality of debugging signal lines comprise one or more of a Test Reset (TSRT) signal line, a Test Mode Select (TMS) signal line, a Test Clock (TCLK) signal line, or a Test Data Input (TDI) signal line.

9. The electronic device of claim 1, wherein the bus is an auxiliary bus of the electronic device.

10. The electronic device of claim 1, wherein the debugging translation block is configured to grant access to debugging capabilities based on whether a valid debug key is provided.

11. The electronic device of claim 1, wherein the debugging state machine comprises one or more registers configured to shift debugging test data into logic circuitry of the first integrated circuit and to capture debugging output data from the logic circuitry.

12. The electronic device of claim 1, wherein the debugging input data is Joint Test Action Group (JTAG) input data and the debugging state machine is a JTAG TAP controller.

13. An electronic device comprising:
a first integrated circuit and second integrated circuit; and
a debugging translation block configured to receive debugging commands from a testing host device via a pipe connection provided by the first integrated circuit, convert the debugging commands into debugging input data, and to provide the debugging input data to a debugging state machine of the second integrated circuit,
wherein the debugging input data comprises debugging test data and debugging instructions, and wherein the debugging translation block is configured to provide the debugging test data and the debugging instructions to the debugging state machine of the second integrated circuit by providing the debugging test data and debugging instructions over a plurality of debugging signal lines.

14. The electronic device of claim 13, further comprising a bus that connects the first integrated circuit and the debugging translation block, wherein the first integrated circuit is configured to provide the pipe connection over the bus.

15. The electronic device of claim 14, wherein the first integrated circuit is configured to provide the pipe connection as a wired connection over the bus to the testing host device.

16. The electronic device of claim 13, wherein the first integrated circuit comprises a wireless chip configured to provide the pipe connection as a wireless connection with a counterpart wireless chip of the testing host device.

17. The electronic device of claim 16, further comprising a bus that connects the first integrated circuit and the debugging translation block, wherein the first integrated circuit is configured to receive the debugging commands via the wireless chip and to send the debugging commands to the debugging translation block over the bus.

18. An electronic device comprising:
a first integrated circuit and a second integrated circuit;
a debugging translation block; and
a bus connecting the first integrated circuit and the debugging translation block,
wherein the first integrated circuit is configured to receive debugging commands from a testing host device and to provide the debugging commands to the debugging translation block over the bus,
and the debugging translation block is configured to convert the debugging commands into debugging input data and to provide the debugging input data to a debugging state machine of the second integrated circuit,
the electronic device further comprising a plurality of signal lines connecting the debugging translation block and the debugging state machine, wherein the debugging translation block is configured to provide the debugging input data to the debugging state machine on the plurality of signal lines.

19. The electronic device of claim 18, wherein the debugging input data comprises Joint Test Action Group (JTAG) input data, and the plurality of signal lines comprise a Test Mode Select (TMS) signal line, a Test Clock (TCK) signal line, and a Test Data Input (TDI) signal line.

20. A method for testing integrated circuits, the method comprising:
receiving, at a debugging translation block, debugging commands from a testing host device via a bus that is connected to one or more integrated circuits and configured to provide a connection to one or more external devices;
converting, at the debugging translation block, the debugging commands into debugging input data; and
providing, from the debugging translation block, the debugging input data to a debugging state machine of a first integrated circuit of the one or more integrated circuits,
wherein the debugging input data comprises debugging test data and debugging instructions, and wherein providing the debugging test data and the debugging instructions to the debugging state machine of the first integrated circuit comprises providing the debugging test data and debugging instructions over a plurality of debugging signal lines.

* * * * *